(12) United States Patent
Williamson

(10) Patent No.: US 7,075,307 B1
(45) Date of Patent: Jul. 11, 2006

(54) METHOD AND APPARATUS FOR DETECTING SHORTS ON INACCESSIBLE PINS USING CAPACITIVE MEASUREMENTS

(75) Inventor: Eddie Williamson, Ft. Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 11/112,471

(22) Filed: Apr. 22, 2005

(51) Int. Cl.
*G01R 31/08* (2006.01)

(52) U.S. Cl. .................. 324/519; 324/530; 324/686

(58) Field of Classification Search ............ None
See application file for complete search history.

(56) References Cited

U.S. PATENT DOCUMENTS

| | | | |
|---|---|---|---|
| 5,420,500 A | 5/1995 | Kerschner | |
| 5,498,964 A | 3/1996 | Kerschner et al. | |
| 5,557,209 A | 9/1996 | Crook et al. | |
| 6,104,198 A | * 8/2000 | Brooks | 324/538 |

\* cited by examiner

*Primary Examiner*—Vincent Q. Nguyen

(57) ABSTRACT

The present invention is a method an apparatus for diagnosing short defects on inaccessible or non-contacted nodes of an integrated circuit device using capacitive coupling techniques. In accordance with the invention, an alternating current (AC) signal generator is connected to apply an alternating current (AC) signal to an accessible node of an IC device under test. Preferably, all remaining accessible nodes of the IC device under test are grounded. A sensor plate of a capacitive sensing probe is placed in signal coupling proximity to the inaccessible node of interest on the integrated circuit device. If a signal is present on the inaccessible node of interest, it is capacitively coupled to the sensor plate of the probe. A measurement device obtains a measurement representative of an amount of current flow capacitively coupled to the sensor plate by the capacitive sensing probe. The possible existence of a short defect between the stimulated accessible node and the inaccessible node can be inferred based on the measurement and/or on a parameter derived from the measurement.

14 Claims, 5 Drawing Sheets

METHOD AND APPARATUS FOR DETECTING SHORTS ON INACCESSIBLE PINS USING CAPACITIVE MEASUREMENTS

BACKGROUND OF THE INVENTION

The present invention relates generally to integrated circuit devices, and more particularly a novel technique for detecting electrical shorts on inaccessible nodes of an integrated circuit device using capacitive measurements.

Integrated circuit assemblies are ubiquitous in modern electronic devices, and a large portion of the industrial sector is devoted to the design and manufacture of such devices. As electronic devices are continually being improved and becoming more sophisticated, so are consumers' expectations for the level of quality of these products. Accordingly, new and improved testing techniques are continuously being sought by manufacturers to test the quality of integrated circuits, printed circuit boards, and integrated circuit assemblies after manufacture and prior to shipment of these devices. While testing entails checking many aspects of the product, such as functionality testing and burn-in testing, one of the most important tests after manufacture is basic continuity testing. Continuity testing includes two components: opens testing and shorts testing. Opens testing is performed to ensure that all connections that are supposed to be connected between components of the device (e.g., integrated circuit pins to printed circuit boards, integrated circuit lead wires to pins, traces connections between printed circuit board nodes, etc.) are intact. Shorts testing is performed to ensure that all connections on the device are connected only between nodes that they are intended by design to connect.

Shorts testing uncovers a commonly found defect known as a "shorted connection", or as used hereinafter, a "short" defect. A short defect is defined as an electrical connection is present between two nodes in the circuit where there should be electrical isolation between the nodes. Short defects typically result from problems in the manufacturing process, such as excess solder due to uneven application of solder paste, the unintentional introduction of conductive particles in the wetting process, etc.

Integrated circuit devices such as integrated circuits, integrated circuit assemblies, printed circuit boards (PCBs), and printed circuit assemblies (PCAs) are typically tested using industrial in-circuit test (ICT) testers. ICT testers are generally equipped with an array of tester interface pins that are configurably connectable to various tester resources (e.g., current sources, voltage sources, measuring devices, etc.). An integrated circuit device may be mounted on a tester fixture that includes a number of probes that connect respective tester interface pins to corresponding respective nodes of the integrated circuit device.

FIG. 1 is a simplified schematic block diagram illustrating a conventional test setup 1 commonly implemented using ICT equipment to test for short defects on an integrated circuit device 13. As illustrated, the integrated circuit device 13 in the example includes four nodes 5, 7, 9, and 11 (labeled N1, N2, N3 and N4). A voltage source 2 is connected via a resistance (R) 3 to node N1. Each of the other nodes N2, N3, and N4 is guarded via connection to ground 12. On a good integrated circuit device 13, no shorts exist and therefore the amount of current flow $I_S$ through the resistor 3 is a known value (determined by measurement using a known good board) that depends on the impedance of E1 6. If a short exists between N1 and any of the other nodes N2, N3, or N4, the current $I_S$ flowing through the resistor 3 will differ from the expected non-shorted value, most likely by a significant (and therefore detectable) increase. This technique allows detection of a short defect between node N1 and any other grounded node N2, N3, N4. The setup and measurement process is performed for each node 5, 7, 9, 11 (N1, N2, N3, N4) relative to each other node in turn. If none of the current flow measurements differ significantly from the expected non-shorted current value, the integrated circuit device 13 contains no short defects.

The above technique is advantageous in that it is simple and works well as long as all nodes on the integrated circuit device under test are accessible. "Accessible" means the ICT equipment can make an ohmic contact with the node through some kind of probing technique. If this condition cannot be met, the node is "inaccessible". FIG. 2 illustrates the test setup 15 of FIG. 1 where node N3 of an integrated circuit device 14 is inaccessible. Accordingly, because node N3 is inaccessible and cannot be guarded (by grounding), a short between node N1 and node N3 will not be detected since, because there is no return to ground on node N3, no current will flow through the resistor (R) 3 (i.e., $I_S$=0).

Real world integrated circuit devices such as ICAs, PCBs, and PCAs will typically have a large number of nodes. As stated above, short defects between nodes of an IC device can render the integrated circuit device inoperative or can damage components of the integrated circuit device if the short is between inappropriate nodes.

Many modern integrated circuit devices are losing access due to shrinking geometries. In some cases, the number of nodes on an integrated circuit device exceeds the number of nodes that currently available ICT equipment can contact. These excess non-contacted nodes as well as those that are simply too small to probe are considered inaccessible and cannot be tested using today's methods.

Accordingly, a need exists for a method for diagnosing short defects on inaccessible or non-contacted nodes of an integrated circuit device.

SUMMARY OF THE INVENTION

The present invention is a method and apparatus for diagnosing short defects on inaccessible or non-contacted nodes of an integrated circuit device using capacitive coupling techniques. In accordance with the invention, an alternating current (AC) signal generator is connected to apply an alternating current (AC) signal to an accessible node of an IC device under test. Preferably, all remaining accessible nodes of the IC device under test are grounded. A sensor plate of a capacitive sensing probe is placed in signal coupling proximity to the inaccessible node of interest on the integrated circuit device. If a signal is present on the inaccessible node of interest, it is capacitively coupled to the sensor plate of the probe. A measurement device obtains a measurement representative of an amount of current flow capacitively coupled to the sensor plate by the capacitive sensing probe. The possible existence of a short defect between the stimulated accessible node and the inaccessible node can be inferred based on the measurement and/or on a parameter derived from the measurement.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION

As used herein, the term "node" refers to the conductive portion of an electrical device that forms a single electrical point in the equivalent schematic diagram of the electrical device. For example, a node can be a pad of an integrated circuit die, a pin, a wire, a solder bump, a pad, a trace, or other interconnecting joint of a component of an integrated circuit device, or any combination thereof. As also used herein, the term "integrated circuit" and "integrated circuit device" may comprise an integrated circuit die, an integrated circuit package, an integrated circuit assembly, a printed circuit board (PCB), and/or a printed circuit assembly (PCA).

The present invention is a technique for diagnosing short defects between an accessible node and an inaccessible node of an IC device. For purposes of discussion only and not limitation, the embodiment described herein will be discussed wherein the integrated circuit device is a printed circuit assembly (PCA). Most modern PCA's have several integrated circuits (ICs) mounted on them. These IC's will typically have many input, output, power, and ground ports (such as pads, pins, etc.) connected to nodes of the printed circuit board (PCB) of the PCA. Some of these nodes are accessible by ICT equipment and some of them are not, for reasons previously described.

It is common to use a capacitive measurement technique to detect open defects on the joints connecting the ports of an IC package to the PCB. For example, U.S. Pat. No. 5,557,209 to Crook et al., U.S. Pat. No. 5,420,500 to Kerschner, and U.S. Pat. No. 5,498,964 to Kerschner et al. describe a capacitive sensing technique that utilizes the device lead frame and other internal elements of an IC under test to form small capacitors with a sensor plate of a capacitive measurement probe that is placed in direct or close proximate contact with the package of the IC under test. Normally each node connected to pins of the IC package is stimulated, and current flow on the lead frame that is capacitively coupled to the sensor plate of the probe is amplified and measured. A measurement greater than a predetermined threshold indicates that the joint connecting the node to its respective port of the IC package on the PCB is intact. A measurement that is too low indicates an open defect for this device and joint.

Figure 1:
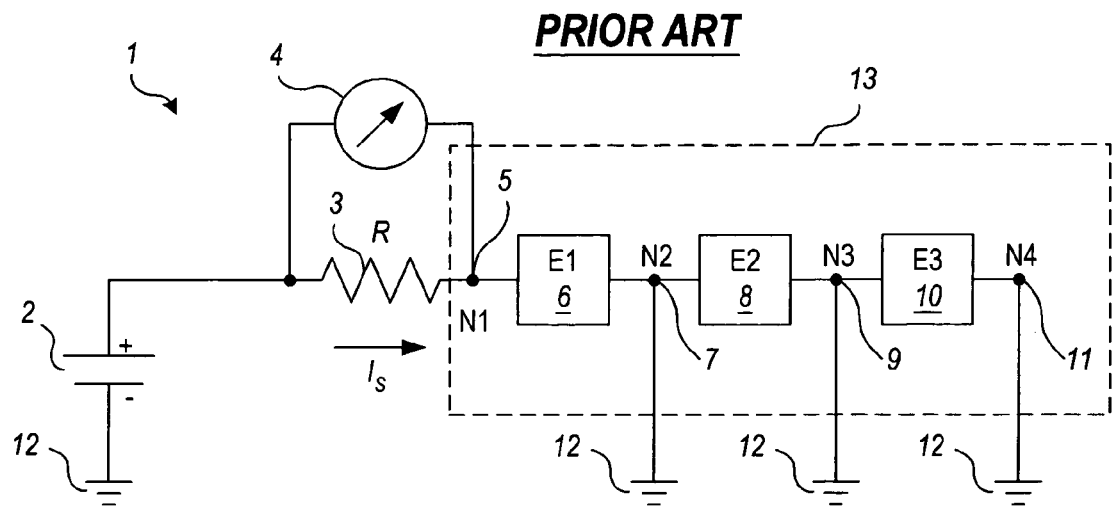
FIG. 1 is a schematic block diagram illustrating a conventional test setup for diagnosing short defects on an integrated circuit device where the nodes of interest are all accessible.
Figure 2:
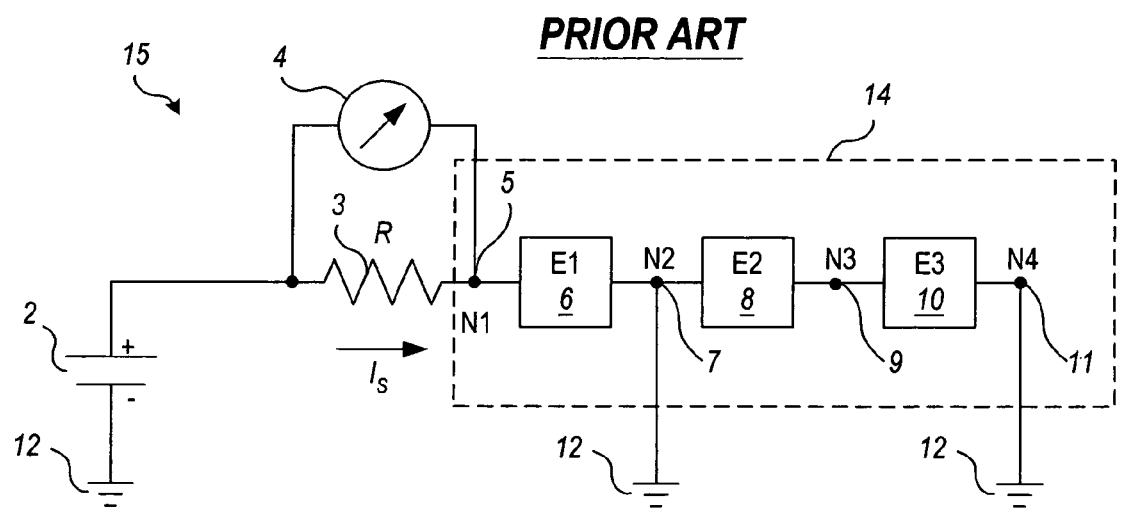
FIG. 2 is a schematic block diagram illustrating a conventional test setup for diagnosing short defects on an integrated circuit device where at least one of the nodes of interest is inaccessible.
Figure 3A:
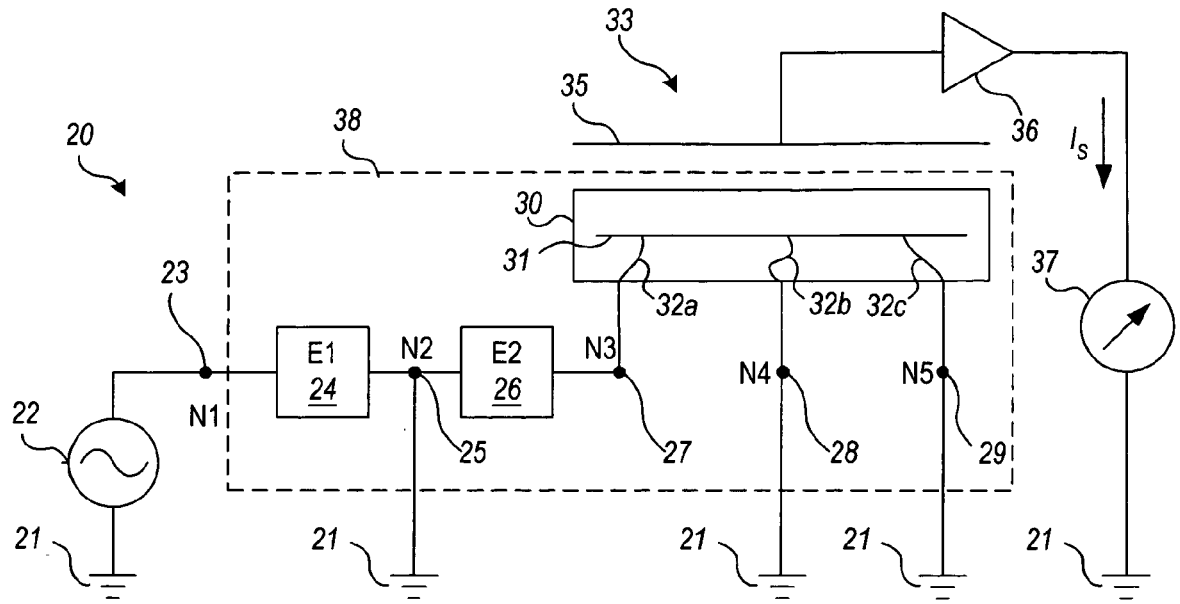
FIG. 3A is a schematic block diagram of a test setup implemented in accordance with the invention for diagnosing a short defect between an inaccessible node and an accessible node in the case where no short defect exists.

FIG. 3A shows an example test setup 20 implemented in accordance with the invention for diagnosing a short defect between an inaccessible node 27 (labeled N3) and an accessible node 23 (labeled N1) of an IC device 38, in this example a PCA comprising an IC package 30 (containing an IC die). In this example node 27 (labeled N3) is inaccessible and all other nodes 23, 25, 28, 29 (labeled N1, N2, N4, and N5) are accessible. Nodes N3, N4, and N5 are electrically connected to ports of an IC package 30. Blocks 24 and 26 (labeled E1 and E2) represent other generic circuit elements present on the IC device 38.

To perform a test, an AC signal generator 22 applies a stimulus signal to one node 23 (N1) with all remaining accessible nodes N2, N4, N5 guarded (i.e., connected to the circuit ground 21). A capacitive sensor probe 33 obtains a measurement $I_S$. In this regard, the capacitive sensor probe 33 includes a sensor plate 35 that is placed on top of, or in close proximity to, the IC package 30 to form a capacitor with the package lead frame 31. Any current flow on any of the nodes connecting to the lead frame via wires 32a, 32b, 32c, will be capacitively coupled to sensor plate 35. A measuring device 34 such as an amplifier 36 followed by an ammeter 37 measures the capacitively coupled current $I_S$. The measurement $I_S$ is representative of the current flow conducted to the lead frame from all nodes 27, 28, 29 (N3, N4, N5) that are connected to an IC port as a result of application of the AC signal to node N1, and may also be used to derive the capacitance value between the lead frame 31 of the IC package 30 and the sensor plate 35 of the capacitive sensor probe 33.

For a normal, good IC device 38 with no short defects the measurement (in the form of current $I_S$ or capacitance $C_S$ that is derived from the current $I_S$) will be approximately zero since the source signal has no way of coupling to the sensor plate 35 of the probe 33. More particularly, current $I_S$ will flow through block 24 (E1) to node 25 (N2) and return to ground at node N2. No current $I_S$ will flow on the package lead frame 31 for coupling to the sensor plate 35 of the probe 33.

Figure 3B:
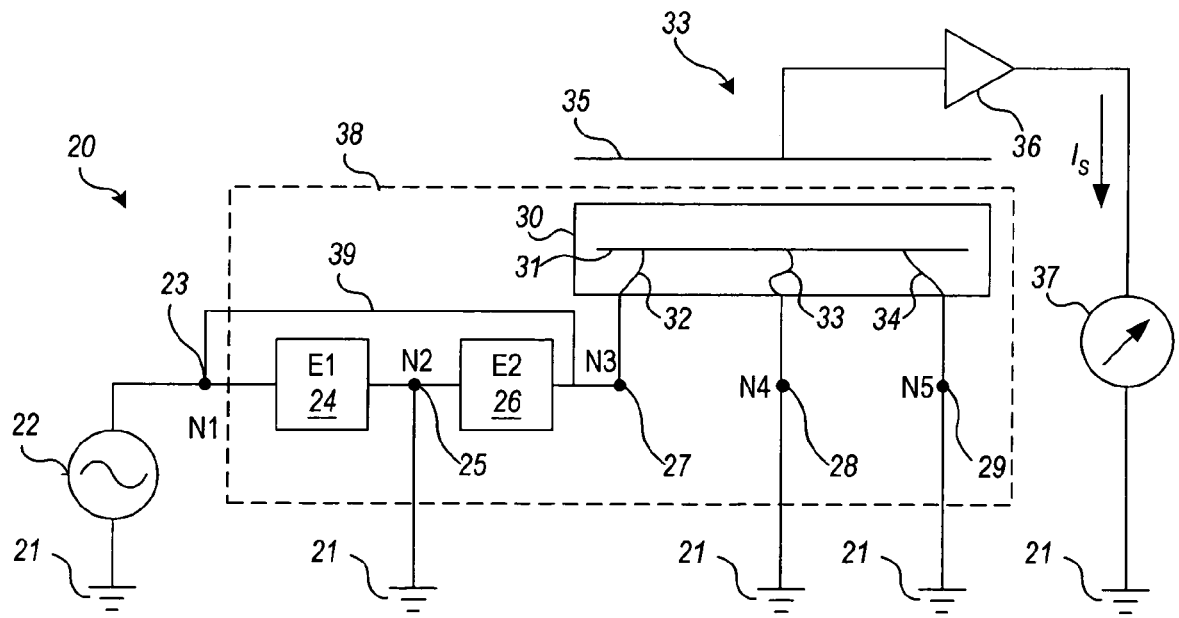
FIG. 3B is a schematic block diagram of the test setup of FIG. 3A in the case where a short defect does exist.

If, however, nodes 23 (N1) and 27 (N3) are shorted together by short 39, as shown in FIG. 3B, then the AC signal generated by AC signal generator 22 is likewise applied to the package lead frame 31 of the IC package 30 just as if node 27 (N3) were stimulated, and the resulting measurement $I_S$ reflects the current on the lead frame 31 that is capacitively coupled to the sensor plate 35.

In summary, if the measured current $I_S$ or derived capacitance $C_S$ is zero (within a predefined tolerance range) there is no short between the accessible node N1 and inaccessible node N3. If the measurement is above some predefined threshold, there is, or is possibly, a short between the accessible node N1 and inaccessible node N3.

This method, if performed for all nodes on the IC device 38, will detect shorts between any pair of inaccessible and accessible nodes as long as the inaccessible node is connected to a device 38 that is accessible by a capacitive sensing probe 33.

Figure 4A:
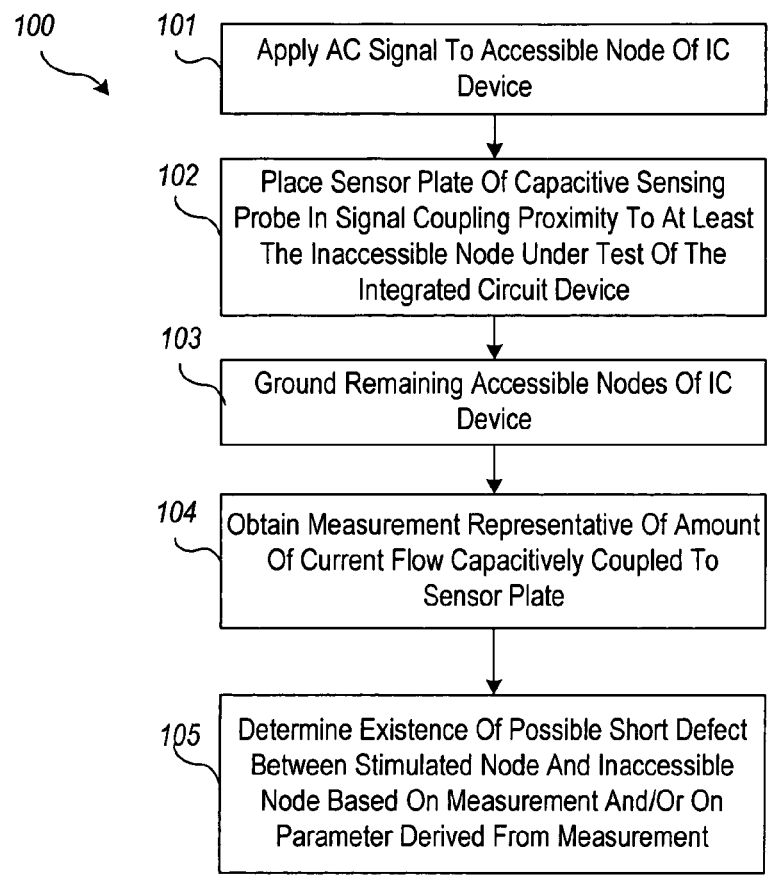
FIG. 4A is an operational flowchart illustrating a preferred embodiment method of test.

FIG. 4A is a flowchart illustrating operation of a test for the test setup 20 of FIGS. 3A and 3B. As shown therein, the method of test 100 includes the steps of: applying an alternating current (AC) signal to an accessible node of the IC device (step 101); placing a sensor plate of a capacitive sensing probe in signal coupling proximity to at least a second non-grounded node of the integrated circuit device which will couple a signal present on the second non-grounded node to the sensor plate if the signal exists (step 102); grounding the remaining accessible nodes of the IC device (step 103); obtaining a measurement representative of an amount of current flow capacitively coupled to the sensor plate by the capacitive sensing probe (step 104); and determining existence of a possible short defect between the first node and the second node based on the measurement and/or on a parameter derived from the measurement (step 105).

Figure 4B:
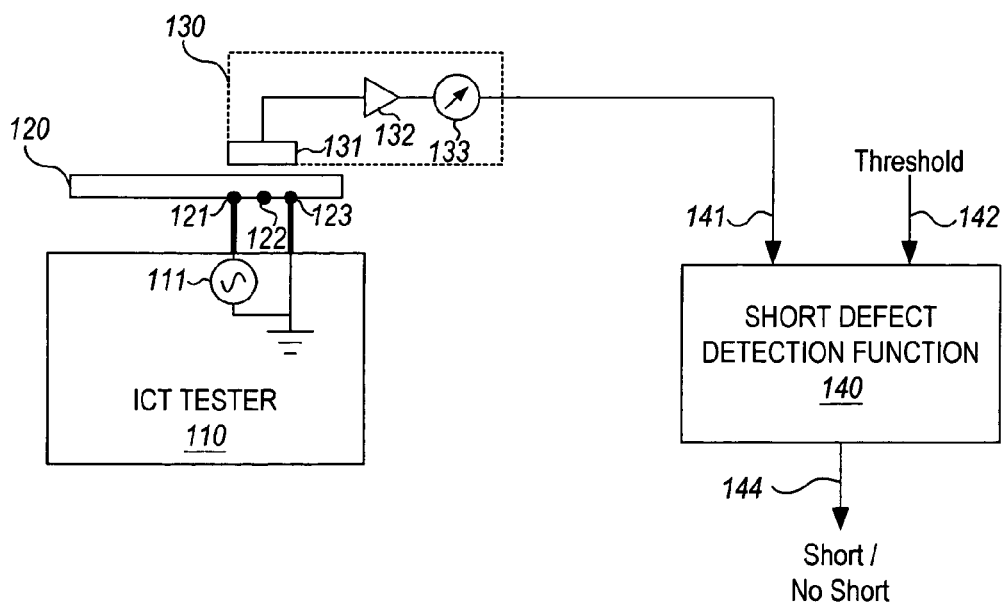
FIG. 4B is a block diagram of a system implementing the invention.

FIG. 4B is a block diagram of a system that implements the invention. The system includes an ICT tester 110 having an AC signal generator 111 whose AC signal output is configurable to be applied (via one or more of a tester interface pin, fixture probe(s), traces, and/or wires) to an accessible node 121 of an IC device under test (DUT) 120. The system also includes a capacitive sensing probe 130 that is configurable to be placed in signal coupling proximity to an inaccessible node under test 122 of the IC DUT 120. The capacitive sensing probe includes a sensor plate 131 that couples to an amplifier 132 followed by an ammeter 133 which takes a current measurement $I_S$ 141.

In the preferred illustrative embodiment, the ICT tester 110 is implemented using an Agilent 3070 In-Circuit Test (ICT) Tester, manufactured by Agilent Technologies, Inc. of Palo Alto, Calif. In this tester, the type of capacitive sensing probe to be used depends on the type of device to be tested. In one illustrative embodiment, the capacitive sensing probe 130 is implemented using an Agilent TestJet probe, also manufactured by Agilent Technologies, Inc. Depending on the device to be tested, the sensitivity of the current reading must be very high in order to accurately distinguish between a measurement of a good connection and a measurement of a short defect. Thus, for example, the Agilent VTEP product which can reliably measure very low current values may be used as the capacitive sensing probe 130 to measure shorts where the IC DUT 120 is a ball grid array, for example.

The measurement $I_S$ 141 is evaluated by a short defect detection function 140 which compares the measurement $I_S$ 141 to a predefined threshold 142, preferably zero plus a predetermined error tolerance. If the measurement $I_S$ 141 is below the threshold 142, the short defect detection function 140 classifies the pair of the accessible node 121 and inaccessible node under test 122 as not exhibiting a short defect. If, on the contrary, the measurement $I_S$ is above the threshold 142, the short defect detection function 140 classifies the node pair 121 and 122 as exhibiting a short defect. The classification is output on signal 144.

Figure 5A:
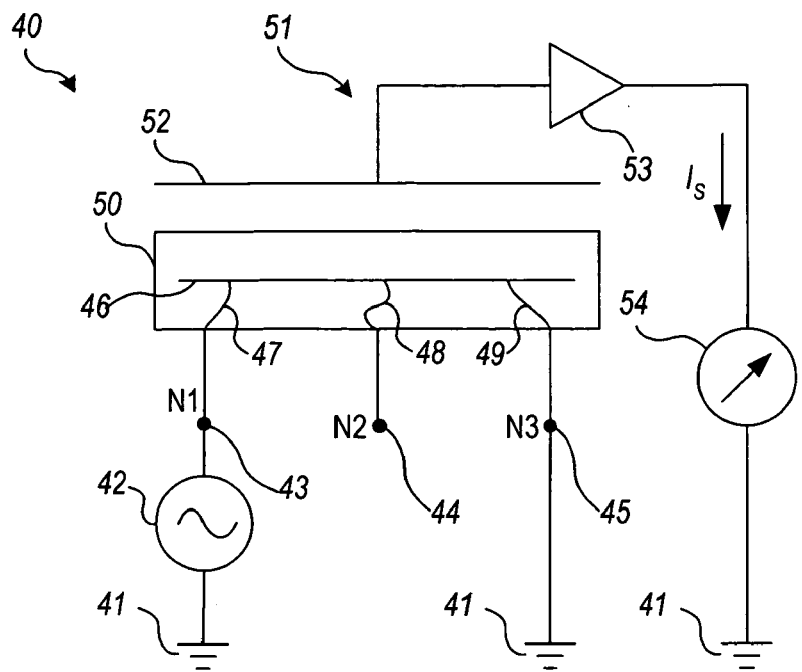
FIG. 5A is a schematic block diagram of an alternative test setup implemented in accordance with the invention for diagnosing a short defect between an inaccessible node and an accessible node in the case where no short defect exists.

FIG. 5A illustrates another test setup 40 implemented according to the principles of the invention. In FIG. 5, node 43 (labeled N1) is stimulated with an AC signal generated by an AC signal generator 42, and node 44 (labeled N2) is inaccessible. The remaining node(s) 45 (labeled N3) are guarded (i.e., connected to a circuit ground 41). In this configuration, the stimulated node 43 (N1) is connected to a signal port of an IC package 50. Current delivered to the package lead frame 46 (for example, due to a short between the stimulated node N1 and an inaccessible node N2 that is also connected to a different signal port on the IC package 30) is detected using a capacitive sensing probe 51 as before, whereby a sensor plate 52 is placed on or in close proximity to the IC package 50, and any capacitively coupled signal $I_S$ is amplified by amplifier 53 and measured by ammeter 54.

The expected measurement value for a good IC device with no short defects, as shown in FIG. 5A, will be equal to the measurement obtained when current flowing only from the stimulated node 43 (N1) is present on the package lead frame 46.

Figure 5B:
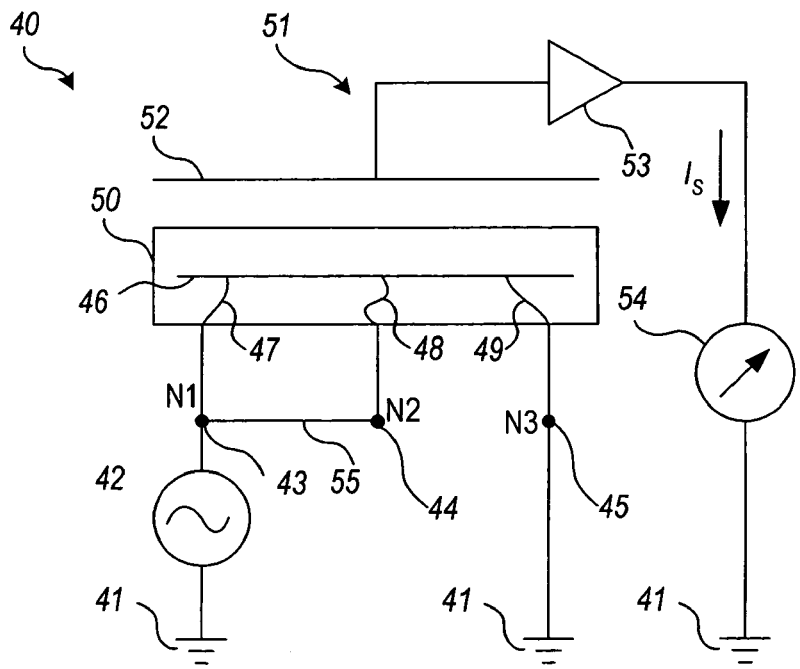
FIG. 5B is a schematic block diagram of the test setup of FIG. 5A in the case where a short defect does exist.

If a short defect 55 exists between the stimulated node 43 (N1) and the inaccessible node 44 (N2), as shown in FIG. 5B, the measurement (for example, as detected by the amplifier 53 followed by the ammeter 54) will be approximately twice the expected value for the good IC device 50.

As before, this method, if performed for all signal nodes on the IC device 50, will detect shorts between any pair of inaccessible and accessible nodes as long as the inaccessible node is connected to a device with a capacitive sensing probe on it.

Figure 6:
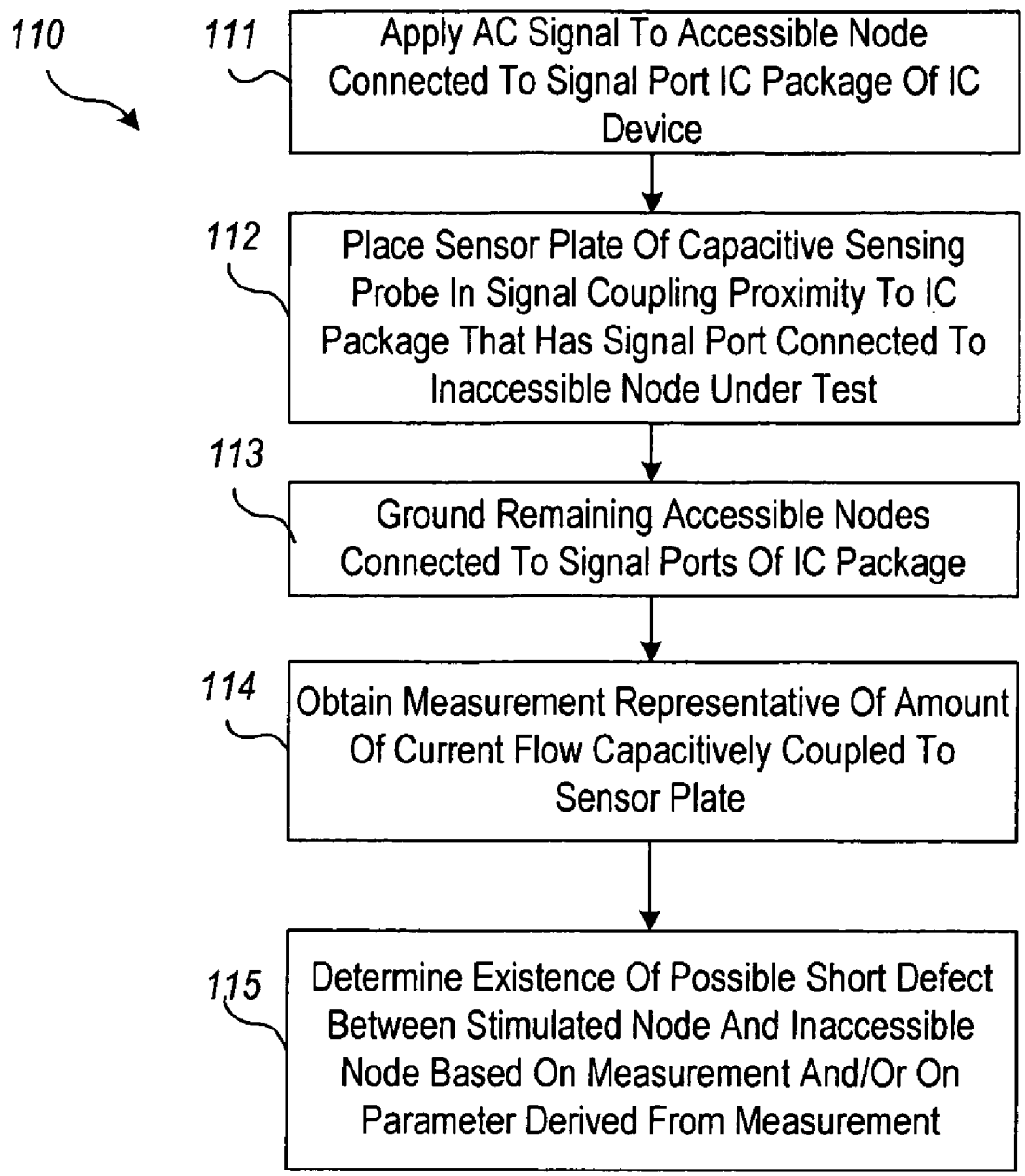
FIG. 6 is a flowchart illustrating operation of a test for the test setup shown in FIGS. 5A and 5B.

FIG. 6 is a flowchart illustrating operation of a test for the test setup 40 of FIGS. 5A and 5B. As shown therein, the method of test 110 includes the steps of: applying an alternating current (AC) signal to an accessible node of the IC device that is connected to a signal port of an IC package that has another signal port connected to the inaccessible node of interest (step 111); placing a sensor plate of a capacitive sensing probe in signal coupling proximity to the IC package (step 112); grounding the remaining accessible nodes that are connected to signal ports of the IC package (step 113); obtaining a measurement representative of an amount of current flow capacitively coupled to the sensor plate by the capacitive sensing probe (step 114); and determining existence of a possible short defect between the first node and the second node based on the measurement and/or on a parameter derived from the measurement (step 115).

Because there are typically a very large number of nodes on a given IC device, it may be desirable to intelligently reduce the number of measurements that must be taken in order to determine the likely candidates for short defects on the device. One technique for shortening the list of nodes to be tested (thereby improving throughput) is by analyzing the IC device and choosing only nodes within the "shorting radius" of the inaccessible nodes. This technique involves examining each place an inaccessible node can be shorted and only looking at other nodes within a predetermined maximum radius of that point. This filters the list to be tested by acknowledging that only certain nodes are likely to be shorted together due to close proximity of one another.

Although this preferred embodiment of the present invention has been disclosed for illustrative purposes, those skilled in the art will appreciate that various modifications, additions and substitutions are possible, without departing from the scope and spirit of the invention as disclosed in the accompanying claims. It is also possible that other benefits or uses of the currently disclosed invention will become apparent over time.

What is claimed is:

1. A method for diagnosing short defects between nodes of an integrated circuit device, comprising the steps of:
   applying an alternating current (AC) signal to a first accessible node of the IC device;
   placing a sensor plate of a capacitive sensing probe in signal coupling proximity to at least a second non-grounded node of the integrated circuit device which will couple a signal present on the second non-grounded node to the sensor plate if the signal exists;
   grounding any remaining accessible nodes of the IC device;
   obtaining a measurement representative of an amount of current flow capacitively coupled to the sensor plate by the capacitive sensing probe; and determining existence of a possible short defect between the first node and the second node based on the measurement and/or on a parameter derived from the measurement.

2. The method of claim 1, wherein:
the second non-grounded node of the integrated circuit device is inaccessible for probing.

3. The method of claim 1, wherein the determining step comprises:
considering that a possible short defect exists if the measurement is above a predefined threshold.

4. The method of claim 3, wherein the predefined threshold is zero plus a predetermined tolerance.

5. The method of claim 1, wherein:
the second non-grounded node is connected to a first signal port of an integrated circuit package, the first signal port connected to a package lead frame of the integrated circuit package; and
the sensor plate of the capacitive sensing probe is place on or in proximity to the integrated circuit package such that the sensor plate is in signal coupling proximity to the package lead frame.

6. The method of claim 5, wherein:
the first accessible node is connected to a second signal port of the integrated circuit package, the second signal port connected to the package lead frame of the integrated circuit package.

7. The method of claim 1, wherein:
the remaining accessible nodes of the integrated circuit device comprise all accessible nodes within a predefined radius of the second non-grounded node.

8. An apparatus for diagnosing short defects between nodes of an integrated circuit device, comprising:
an alternating current (AC) signal generator which applies an alternating current (AC) signal to a first accessible node of the IC device;
a capacitive sensing probe having a sensor plate which, when placed in signal coupling proximity to at least a second non-grounded node of the integrated circuit device, capacitively couples a signal present on the second non-grounded node to the sensor plate, if the signal exists;
grounding means for grounding any remaining accessible nodes of the IC device;
a measurement device which obtains a measurement representative of an amount of current flow capacitively coupled to the sensor plate by the capacitive sensing probe; and
a short fault detection function which determines a possible existence of a short defect between the first node and the second node based on the measurement and/or on a parameter derived from the measurement.

9. The apparatus of claim 8, wherein:
the second non-grounded node of the integrated circuit device is inaccessible for probing.

10. The apparatus of claim 8, wherein the determining step comprises:
short defect detection function determines that a possible short defect exists if the measurement is above a predefined threshold.

11. The apparatus of claim 10, wherein the predefined threshold is zero plus a predetermined tolerance.

12. The apparatus of claim 8, wherein:
the second non-grounded node is connected to a first signal port of an integrated circuit package, the first signal port connected to a package lead frame of the integrated circuit package; and
the sensor plate of the capacitive sensing probe is place on or in proximity to the integrated circuit package such that the sensor plate is in signal coupling proximity to the package lead frame.

13. The apparatus of claim 12, wherein:
the first accessible node is connected to a second signal port of the integrated circuit package, the second signal port connected to the package lead frame of the integrated circuit package.

14. The apparatus of claim 8, wherein:
the remaining accessible nodes of the integrated circuit device comprise all accessible nodes within a predefined radius of the second non-grounded node.

* * * * *